(12) United States Patent
Chiyoma et al.

(10) Patent No.: US 10,007,004 B2
(45) Date of Patent: *Jun. 26, 2018

(54) APPARATUS AND METHOD OF MANUFACTURING RADIATION DETECTION PANEL

(71) Applicant: TOSHIBA ELECTRON TUBES & DEVICES CO., LTD., Otawara-shi (JP)

(72) Inventors: Hitoshi Chiyoma, Otawara (JP); Atsuya Yoshida, Nasushiobara (JP); Wataru Matsuyama, Nasushiobara (JP); Toyoo Yamamoto, Nasushiobara (JP); Hiroshi Aida, Otawara (JP); Yuichi Shimba, Utsunomiya (JP)

(73) Assignee: TOSHIBA ELECTRON TUBES & DEVICES CO., LTD., Otawara-shi (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/697,127

(22) Filed: Sep. 6, 2017

(65) Prior Publication Data
US 2017/0363751 A1    Dec. 21, 2017

Related U.S. Application Data

(63) Continuation of application No. 14/301,460, filed on Jun. 11, 2014, now Pat. No. 9,880,292, which is a
(Continued)

(30) Foreign Application Priority Data

Dec. 16, 2011  (JP) ................. 2011-276157
Dec. 16, 2011  (JP) ................. 2011-276158
(Continued)

(51) Int. Cl.
*G01T 1/20* (2006.01)
*C23C 14/50* (2006.01)
(Continued)

(52) U.S. Cl.
CPC ............ *G01T 1/20* (2013.01); *C23C 14/0694* (2013.01); *C23C 14/225* (2013.01); *C23C 14/24* (2013.01); *C23C 14/505* (2013.01); *G01T 1/202* (2013.01)

(58) Field of Classification Search
None
See application file for complete search history.

(56) References Cited

U.S. PATENT DOCUMENTS 8,735,830 B1 * 5/2014 Nagarkar ............ G01T 1/2008
250/362
2009/0000552 A1  1/2009 Sohda
(Continued)

FOREIGN PATENT DOCUMENTS

CN    2632980 Y    8/2004
CN   101053042 A   10/2007
(Continued)

OTHER PUBLICATIONS

International Search Report dated Mar. 12, 2013 for PCT/JP2012/081674 filed on Dec. 6, 2012 with English Translation.
(Continued)

*Primary Examiner* — Nathan T Leong
(74) *Attorney, Agent, or Firm* — Oblon, McClelland, Maier & Neustadt, L.L.P.

(57) ABSTRACT

According to one embodiment, an apparatus of manufacturing a radiation detection panel, includes an evaporation source configured to evaporate a scintillator material and emit the scintillator material vertically upward, a holding mechanism located vertically above the evaporation source,
(Continued)

and holding a photoelectric conversion substrate, and a heat conductor arranged opposite to the holding mechanism with a gap.

6 Claims, 9 Drawing Sheets

Related U.S. Application Data continuation of application No. PCT/JP2012/081674, filed on Dec. 6, 2012.

(30) Foreign Application Priority Data

Dec. 16, 2011 (JP) .................................. 2011-276207
Dec. 16, 2011 (JP) .................................. 2011-276208

(51) Int. Cl.
*C23C 14/24* (2006.01)
*C23C 14/06* (2006.01)
*G01T 1/202* (2006.01)
*C23C 14/22* (2006.01)

(56) References Cited

U.S. PATENT DOCUMENTS

| | | | |
|---|---|---|---|
| 2009/0008574 A1* | 1/2009 | Okamura | C09K 11/7733 250/484.4 |
| 2009/0084982 A1* | 4/2009 | Kudo | G01T 1/202 250/484.4 |
| 2011/0017925 A1 | 1/2011 | Okamura et al. | |

FOREIGN PATENT DOCUMENTS

| | | |
|---|---|---|
| JP | 4-26586 A | 1/1992 |
| JP | 5-249299 A | 9/1993 |
| JP | 7-191195 A | 7/1995 |
| JP | 10-40840 A | 2/1998 |
| JP | 11-100674 | 4/1999 |
| JP | 2003-262673 A | 9/2003 |
| JP | 2004-340913 A | 12/2004 |
| JP | 2005-164534 A | 6/2005 |
| JP | 2007-315866 A | 12/2007 |
| JP | 2008-82872 | 4/2008 |
| JP | 2009-13435 A | 1/2009 |
| JP | 2009-14526 A | 1/2009 |
| JP | 2009-236705 A | 10/2009 |
| JP | 2010-14469 A | 1/2010 |
| JP | 2010-25620 A | 2/2010 |
| JP | 2011-22068 A | 2/2011 |
| TW | I290231 | 11/2007 |
| WO | 2007/058022 A1 | 5/2007 |
| WO | WO 2009/122772 A1 | 10/2009 |

OTHER PUBLICATIONS

International Written Opinion dated Mar. 12, 2013 for PCT/JP2012/081674 filed on Dec. 6, 2012.
English translation of the International Preliminary Report on Patentability and Written Opinion dated Jun. 26, 2014, in PCT/JP2012/081674 filed Dec. 6, 2012.
Combined Taiwanese Office Action and Search Report dated Sep. 24, 2014, in Taiwan Patent Application No. 101147241 (with English translation of Search Report ).
Japanese Office Action dated Dec. 9, 2014, in Japan Patent Application No. 2013-549229 (with English translation).
Extended European Search Report dated Jul. 3, 2015 in Patent Application No. 12856845.8.
Office Action dated Nov. 19, 2015 in Korean Patent Application No. 10-2014-7005519 with English translation.
Office Action and Search Report dated Jun. 30, 2015 in the corresponding Chinese Patent Application No. 201280045409.4 (with English Translation).
Gu Mu, et al.. "High Power Laser and Particle Beams", Growth process of CsI scintillating films with micro-columnar structure by thermal evaporation, vol. 22. No. 2, Feb. 28, 2010, 5 pages.
Robert W. Berry, et al., "Thin Film Technology", Bell Telephone Lab. Series, 1968, 3 pages.
Office Action dated Apr. 26, 2016 in Japanese Patent Application No. 2015-133463 with English translation.

\* cited by examiner

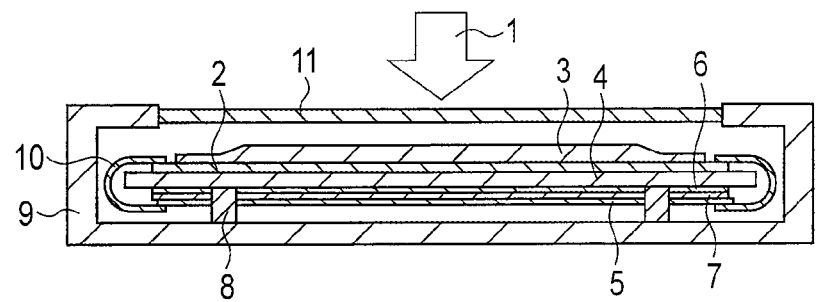
F I G. 1
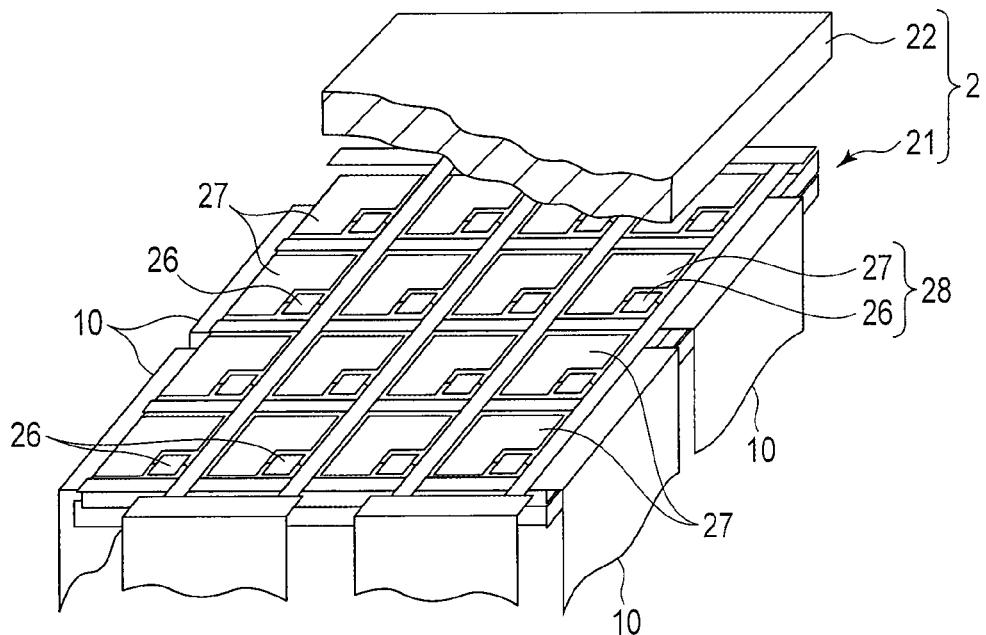
F I G. 2

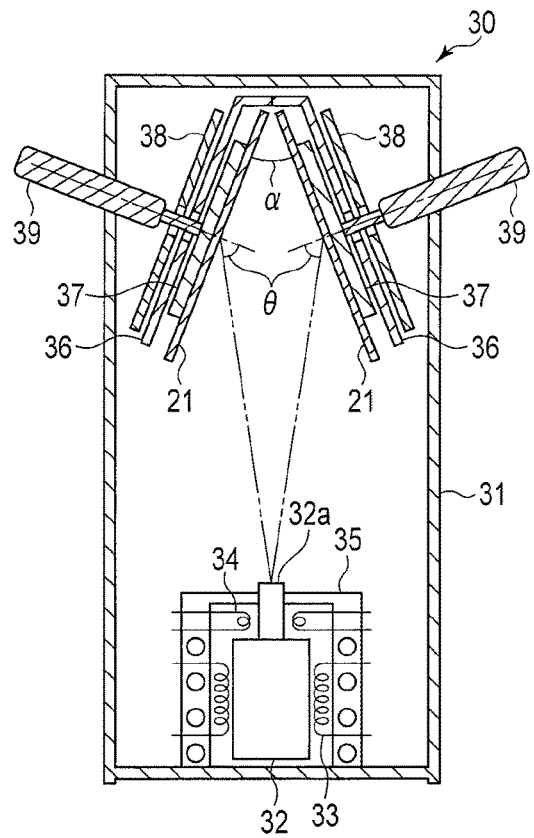
F I G. 3
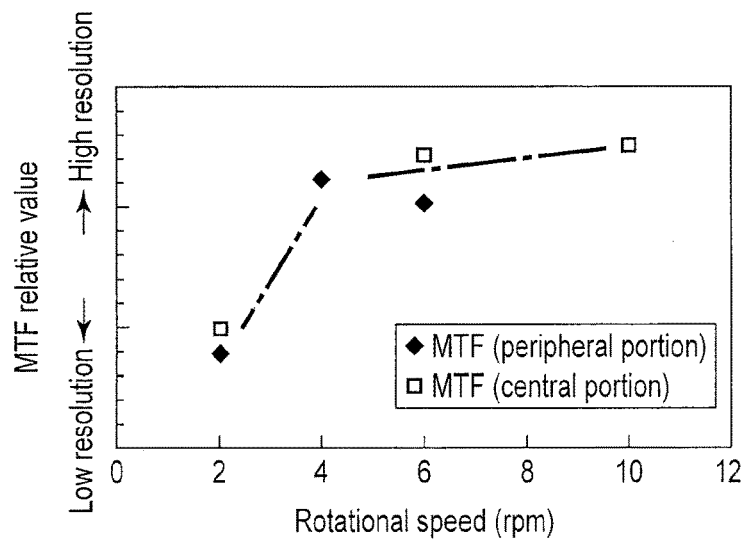
F I G. 4

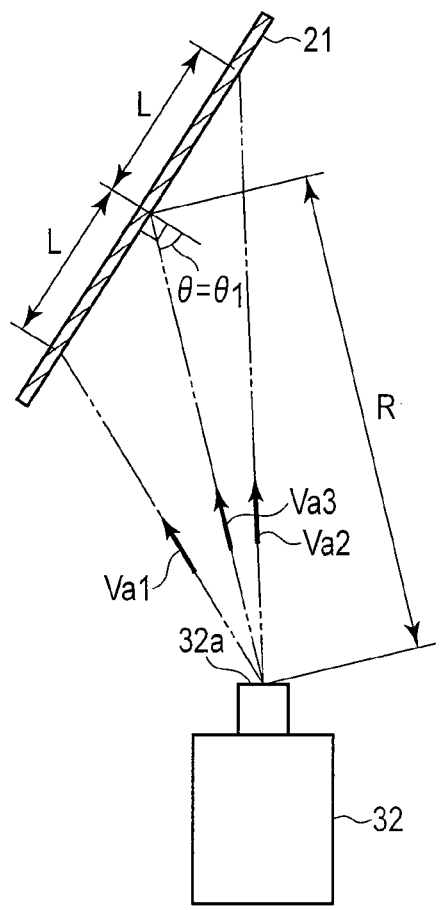
F I G. 5

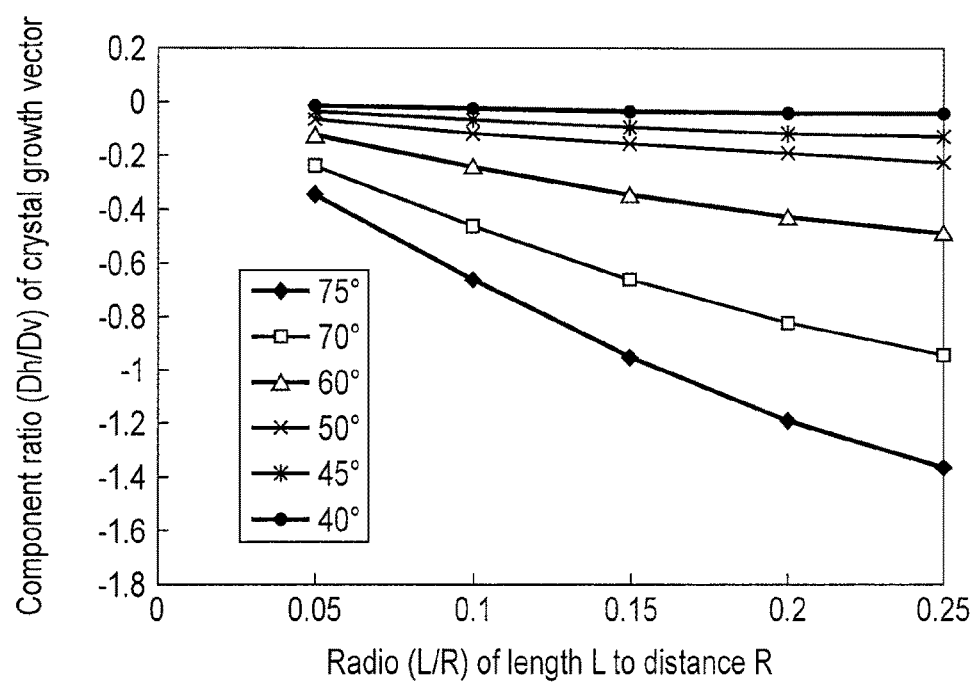
F I G. 7

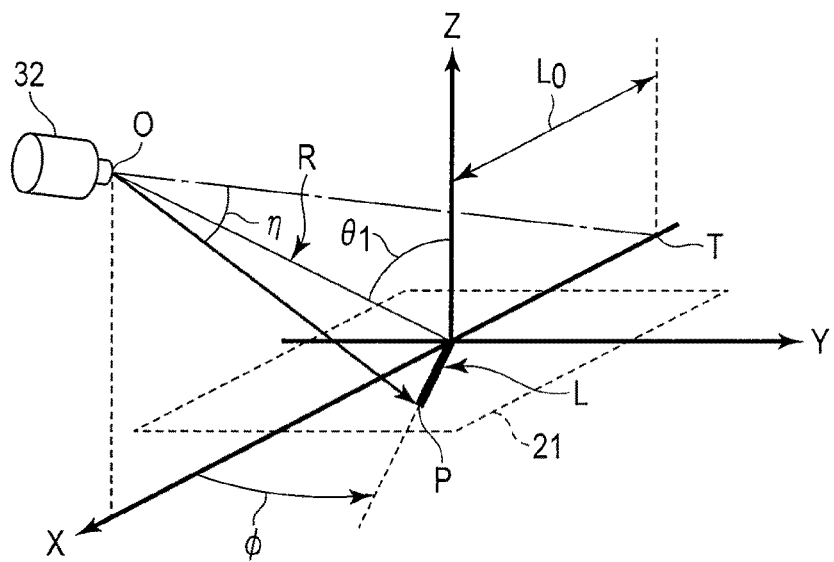
F I G. 8
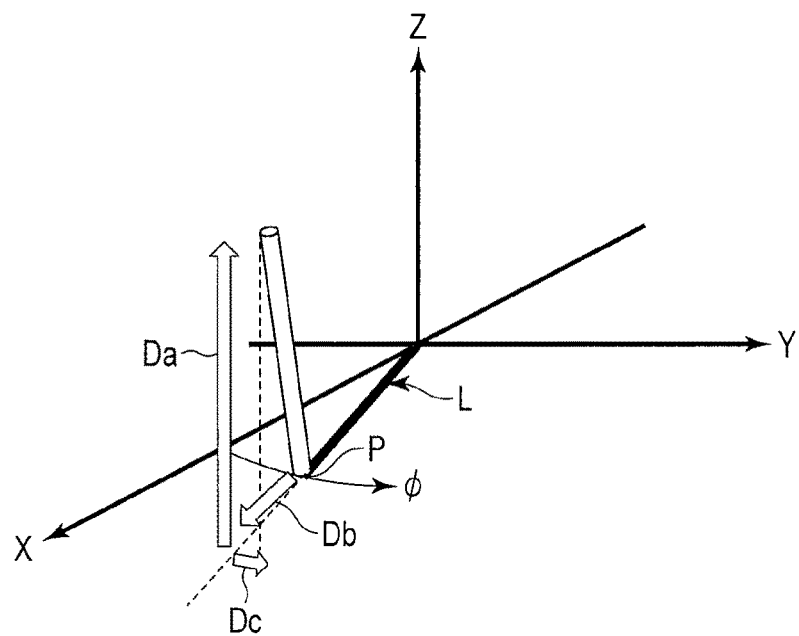
F I G. 9

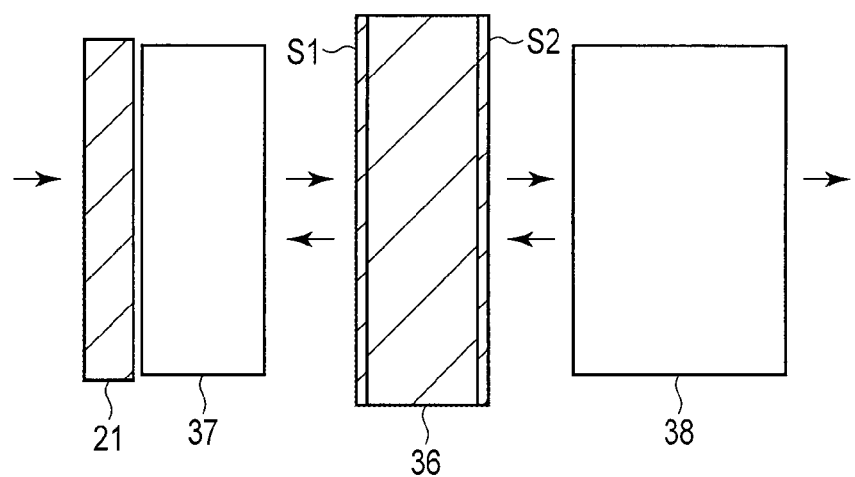
F I G. 14

APPARATUS AND METHOD OF MANUFACTURING RADIATION DETECTION PANEL

CROSS REFERENCE TO RELATED APPLICATIONS

This application is a Continuation of U.S. application Ser. No. 14/301,460 filed Jun. 11, 2014, which is a Continuation Application of PCT Application No. PCT/JP2012/081674, filed Dec. 6, 2012 and based upon and claiming the benefit of priority from prior Japanese Patent Applications No. 2011-276157, filed Dec. 16, 2011; No. 2011-276158, filed Dec. 16, 2011; No. 2011-276207, filed Dec. 16, 2011; and No. 2011-276208, filed Dec. 16, 2011, the entire contents of all of which are incorporated herein by reference.

FIELD

Embodiments described herein relate generally to an apparatus and method of manufacturing a radiation detection panel.

BACKGROUND

As radiation detection panels, X-ray detection panels have recently been put to practical use. The X-ray detection panels include a fluorescent film for converting an X-ray (radioactive ray) into light, and a photoelectric conversion element for converting the light into an electric signal. Such X-ray detection panels can contribute to reduction of the size of the entire X-ray flat detector, compared to conventional X-ray image tubes. The X-ray flat detector converts, into digital electric information, the image information corresponding to the X-rays having passed through an inspection target. The X-ray flat detector can provide various digital information processing functions, such as digital image processing and digital image storage.

The X-ray flat detector is widely used for various purposes, such as medical and dental treatments of patients, industrial inspections including nondestructive inspections, scientific researches including architectural analysis. In these fields, high-precision image extraction and high-speed image detection are possible by digital information processing, with the result that the amount of undesirable X-ray (radioactive ray) exposure can be reduced, and prompt inspection, prompt diagnosis, etc., can be realized.

Scintillator material techniques are often diverted to the forming of a fluorescent film for the X-ray flat detector. In the X-ray flat detector, a scintillator material is formed of a material containing, as main components, cesium (Cs) and iodine (I) used in the conventional X-ray image tubes. The scintillator material, which contains cesium iodide (CsI) as a main component and is to be grown into columnar crystals, can enhance sensitivity and resolution by virtue of optical guide effect, compared to another scintillator material forming granular crystals.

To secure the X-ray flat detector in a highly sensitive state, it is necessary to acquire light (fluorescent light) of a sufficient intensity, into which an X ray is converted, and to form the fluorescent film to a certain thickness. When a scintillator material containing CsI as a main component is used, the fluorescent film may often be formed to a thickness of about 500 μm.

On the other hand, the fluorescent film has a tendency to reduce the resolution of an image when its thickness is increased. In order for the fluorescent film to simultaneously have high sensitivity and high resolution, it is desirable to employ a deposition method capable of forming thinner columnar crystals of the scintillator material and forming the columnar crystals more uniformly in the thickness direction.

The conventional X-ray image tube manufacturing method and the conventional X-ray flat detector manufacturing method disclose film forming methods associated with scintillator materials. Further, as a similar manufacturing method, a method of manufacturing a radiation image conversion panel using photostimulable phosphor is well known.

A manufacturing apparatus for depositing evaporated scintillator material particles on the surface of a photoelectric conversion substrate comprises a vacuum chamber and a crucible placed in the vacuum chamber. When depositing the scintillator material, the photoelectric conversion substrate is arranged horizontally above the crucible in the vacuum chamber. After that, the scintillator material is heated in the crucible and evaporated therefrom. As a result, the evaporated scintillator material is deposited on the surface of the photoelectric conversion substrate. There is a case where the evaporated scintillator material is deposited on the surface of the photoelectric conversion substrate, with the photoelectric conversion substrate kept rotated on a horizontal plane.

BRIEF DESCRIPTION OF THE DRAWINGS

FIG. 1 is a schematic cross-sectional view of an X-ray flat detector that includes an X-ray detection panel produced by an X-ray detection panel manufacturing method according to an embodiment;

FIG. 2 is an exploded perspective view showing part of the X-ray flat detector;

FIG. 3 schematically shows the structure of a vacuum deposition device according to the embodiment;

FIG. 4 is a graph showing changes in MTF relative value to the rotational speed of a photoelectric conversion substrate;

FIG. 5 is a schematic view showing part of the vacuum deposition device, a crucible and the photoelectric conversion substrate;

FIG. 7 is a graph showing changes in a component ratio (Dh/Dv) relative to a ratio (L/R), assumed when an incident angle $\theta_1$ is set to 40°, 45°, 50°, 60°, 70° and 75°;

FIG. 8 is a view showing a coordinate system in which the vacuum chamber, the crucible and the photoelectric conversion substrate shown in FIGS. 3 and 5 are made to correspond to coordinates;

FIG. 9 shows the coordinate system of FIG. 8 and the growing directional component of a columnar crystal at a point P at each moment;

FIG. 14 shows the photoelectric conversion substrate, the heat conductor, the holding mechanism and radiator shown in FIG. 3, and is a schematic view for explaining the function of a heat conductor.

DETAILED DESCRIPTION

Figure 6:
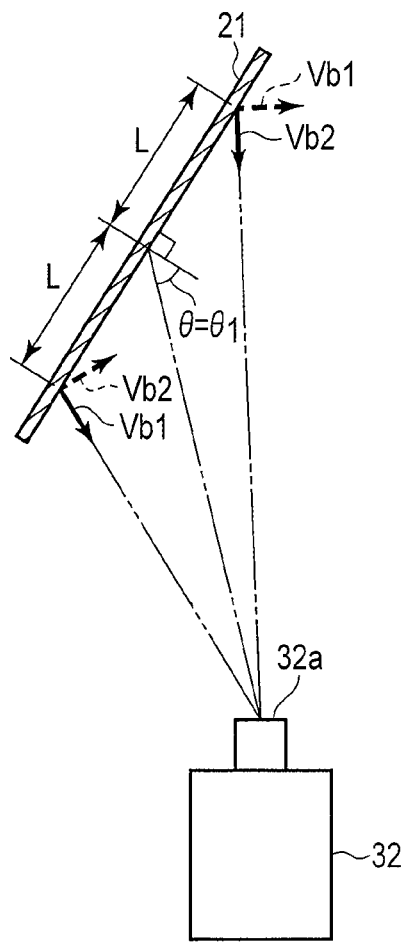
FIG. 6 is another schematic view showing part of the vacuum deposition device, a crucible and the photoelectric conversion substrate.

In general, according to one embodiment, there is provided an apparatus of manufacturing a radiation detection panel, comprising an evaporation source configured to evaporate a scintillator material and emit the scintillator material vertically upward, a holding mechanism located vertically above the evaporation source, and holding a photoelectric conversion substrate such that a deposition surface of the photoelectric conversion substrate exposed to the evaporation source and inclined with respect to a vertical axis, and a heat conductor positioned through the holding mechanism and away from the photoelectric conversion substrate and arranged opposite to the holding mechanism with a gap.

According to another embodiment, there is provided a method of manufacturing a radiation detection panel, comprising positioning a photoelectric conversion substrate vertically above an evaporation source such that a deposition surface of the photoelectric conversion substrate is exposed to the evaporation source and inclined with respect to a vertical axis, evaporating a scintillator material and emitting the scintillator material vertically upward by the evaporation source to deposit a fluorescent film on the deposition surface, and controlling a temperature of the photoelectric conversion substrate within a range of 70° to 140° in an initial deposition stage, and controlling the temperature of the photoelectric conversion substrate within a range of 125° to 190° after the initial deposition stage.

Referring now to the accompanying drawings, a detailed description will be given of a method and apparatus of manufacturing an X-ray detection panel according to an embodiment. Firstly, the structure of the X-ray detection panel manufactured by the X-ray detection panel manufacturing method will be described. The overall structure of the X-ray flat detector using the X-ray detection panel will also be described.

FIG. 1 is a schematic cross-sectional view of the X-ray flat detector. As shown in FIG. 1, the X-ray flat detector is of a large size. The X-ray flat detector comprises an X-ray detection panel 2, a moisture-proof cover 3, a supporting substrate 4, a circuit board 5, an X-ray shielding lead plate 6, a heat-dissipating insulating sheet 7, a connection member 8, a housing 9, a flexible printed circuit 10 and an incident window 11.

FIG. 2 is an exploded perspective view showing part of the X-ray flat detector. As shown in FIGS. 1 and 2, the X-ray detection panel 2 includes a photoelectric conversion substrate 21 and a fluorescent film 22. The photoelectric conversion substrate 21 includes a glass substrate with a thickness of 0.7 mm, and a plurality of photodetectors 28 two-dimensionally arranged on the glass substrate. The photodetectors 28 each include a thin film transistor (TFT) 26 as a switching element, and a photodiode (PD) 27 as a photosensor. The TFT 26 and PD 27 are formed using, for example, amorphous silicon (a-Si) as a matrix. The photoelectric conversion substrate 21 has, for example, a square shape with one side of 50 cm. In large X-ray flat detectors, the photoelectric conversion substrate 21 has one side of, for example, 13 to 17 inches.

The fluorescent film 22 is arranged directly on the photoelectric conversion substrate 21. The fluorescent film 22 is positioned on the X-ray incident side of the photoelectric conversion substrate 21. The fluorescent film 22 is used to convert an X ray into light (fluorescent light). The PD 27 is used to convert the light from the fluorescent film 22 into an electric signal.

The fluorescent film 22 is formed by depositing a scintillator material on the photoelectric conversion substrate 21. As the scintillator material, a material containing cesium iodide (CsI) as a main component can be used. The thickness of the fluorescent film 22 is set within a range of 100 to 1000 μm. More preferably, the thickness of the fluorescent film 22 is set within a range of 200 to 600 μm in view of sensitivity and resolution.

In the embodiment, the thickness of the fluorescent film 22 is adjusted to 500 μm. Further, as the scintillator material, a material obtaining by adding thallium (Tl) or thallium iodide (TlI) to cesium iodide (CsI) as the main component is used. As a result, the fluorescent film 22 can emit light (fluorescent light) of an appropriate wavelength upon receiving an X ray.

For instance, it is preferable that the amount of added thallium iodide (TlI) be several % or less in concentration, and hence the amount of cesium iodide (CsI) in the scintillator material be 95% or more in concentration.

As shown in FIG. 1, the moisture-proof cover 3 completely covers the fluorescent film 22 to seal the same. The moisture-proof cover 3 is formed of, for example, an aluminum alloy. If the thickness of the moisture-proof cover 3 is increased, an X-ray dosage entering the fluorescent film 22 is decreased to thereby degrade the sensitivity of the X-ray detection panel 2. Therefore, it is desirable that the moisture-proof cover 3 should be formed as thin as possible. To set the thickness of the moisture-proof cover 3, consideration is given to balance in various parameters (the stableness of the shape of the moisture-proof cover 3, the manufacturing tolerant strength of the same, the attenuation of the X-ray entering the fluorescent film 22). The thickness of the moisture-proof cover 3 is set within a range of 50 to 500 μm. In the embodiment, the thickness of the moisture-proof cover 3 is adjusted to 200 μm.

A plurality of pads to be connected to the outside are provided on the outer periphery of the photoelectric conversion substrate 21. The pads are used for output of detecting signal and input of electric signal for driving the photoelectric substrate 21.

Since the assembly of the X-ray detection panel 2 and the moisture-proof cover 3 is formed by stacking thin members, it is light and weak. Therefore, the X-ray detection panel 2 is secured to a flat surface of the supporting substrate 4 via an adhesive sheet. The supporting substrate 4 is formed of, for example, an aluminum alloy, and has a strength necessary to reliably support the X-ray detection panel 2.

The circuit board 5 is secured to the other surface of the supporting substrate 4 via the lead plate 6 and the heat-dissipating insulating sheet 7. The circuit board 5 is fixed to the supporting substrate 4 by means of, for example, screws. The circuit board 5 and the X-ray detection panel 2 are connected to each other via the flexible printed circuit 10. Thermal compression bond utilizing an anisotropic conductive film (ACF) is used for the connection of the flexible printed circuit 10 and the photoelectric conversion substrate 21. By virtue of this method, electrical connection of a plurality of fine signal lines is secured. A connector corresponding to the flexible printed circuit 10 is mounted on the circuit board 5. The circuit board 5 is electrically connected to the X-ray detection panel 2 via the connector. The circuit board 5 is configured to electrically drive the X-ray detection panel 2 and electrically process signals output from the X-ray detection panel 2.

The housing 9 houses the X-ray detection panel 2, the moisture-proof cover 3, the supporting substrate 4, the circuit board 5, the lead plate 6, the heat-dissipating insulating sheet 7, and the connection member 8. The housing 9 has an opening formed in a position opposing the X-ray detection panel 2. The connection member 8 is secured to the housing 9 to support the supporting substrate 4.

The incident window 11 is fitted in the opening of the housing 9 to seal the opening. X-rays are permitted to pass through the incident window 11 and reach the X-ray detection panel 2. The incident window 11 is formed flat and has a function of protecting the interior of the housing 9. It is desirable to form the incident window 11 of a thin member having a low X-ray absorption factor. By virtue of this structure, the degree of scattering of X rays and the attenuation of the X-ray dosage on the incident window 11 can be reduced, whereby a thin and light X-ray detector can be realized. The X-ray detector is constructed as described below.

A description will be given of a vacuum deposition device used in an apparatus for manufacturing the X-ray detection panel 2.

FIG. 3 schematically shows the structure of a vacuum deposition device 30. As shown in FIG. 3, the vacuum deposition device 30 includes a vacuum chamber 31, a crucible 32 as a vapor source for thermally melting and evaporating the scintillator material, heaters 33 and 34, a cover 35, heat conductors 36, holding mechanisms 37, radiator 38 as temperature adjusting members, and motors 39.

The vacuum chamber 31 is formed in a rectangular shape with a greater height (vertical dimension) than a width (horizontal dimension). A vacuum exhaust device (vacuum pump) (not shown) is attached to the vacuum chamber 31. The vacuum exhaust device can hold the interior of the vacuum chamber 31 under the atmospheric pressure. The vacuum deposition device 30 utilizes vacuum deposition method performed under a desired pressure below the atmospheric pressure.

The crucible 32 is located in a lower position in the vacuum chamber 31. A scintillator material obtained by adding TlI to CsI as the main component is input into the crucible 32. For instance, a scintillator material containing cesium iodide (CsI) with a concentration of 95% or more can be used. There is another method of inputting a scintillator material containing cesium iodide (CsI) with a concentration of 100%, and evaporating a small amount of thallium iodide (TlI) from another small crucible. Even in the latter case, the structure of the columnar crystal is determined by cesium iodide (CsI), and therefore the same description can be given of the advantage associated with the arrangement of the crucible 32 in the vacuum chamber 31.

The crucible 32 has a central upper end portion formed cylindrical (like a chimney pipe) and protruded in the height direction of the vacuum chamber 31. An evaporation port 32a positioned at the tip of the crucible 32 is upwardly open in the vacuum chamber 31. The scintillator material is emitted vertically upward at the center the vertical axis through the center of the evaporation port 32a.

A heater 33 is provided around the crucible 32. The heater 33 is configured to heat the crucible 32 so as to adjusted the temperature of the same to a value higher than the melting point of the scintillator material. In the embodiment, the heater 33 heats the crucible 32 to about 700° C. The temperature of the crucible 32 can be measured by a thermometer (not shown), and the temperature monitoring of the crucible 32 and the driving of the heater 33 can be performed by a heater driving mechanism (not shown).

When the crucible 32 has been heated as described above, evaporated element particles of the scintillator material are upwardly emitted through the evaporation port 32a of the crucible 32 in the vacuum chamber 31. Further, since the upper end portion of the crucible 32 is formed cylindrical, the scintillator material can be emitted with high directivity. By virtue of the above structure, the scintillator material is intensively emitted in the direction in which the photoelectric conversion substrate(s) 21 is located. By adjusting the length of the upper end portion of the crucible 32, the directivity of the emission of the scintillator material can be adjusted.

In the embodiment, to produce a large X-ray detection panel 2, it is necessary to deposit a great amount (e.g., 400 g) of scintillator material on the photoelectric conversion substrate 21. To this end, a large crucible 32 is employed and several kilograms (e.g., 6 kg) or more of scintillator material is input in the crucible.

A heater 34 is provided around the tip portion of the crucible 32 to heat the tip portion. As a result, blocking of the tip portion of the crucible 32 can be prevented.

The cover 35 covers the crucible 32 and the heaters 33 and 34 to suppress unnecessary radiation of heat from them. The cooling channel through which coolant (for example, water) flows is formed in the cover 35.

The heat conductors 36 are provided in upper positions in the vacuum chamber 31 and secured thereto. The heat conductors 36 are each in the shape of, for example, a plate with a thickness of 3 mm. The heat conductors 36 may be formed of, for example, aluminum. The heat conductors 36 have a function of transmitting the heat of the heat dissipating members 38 to the photoelectric conversion substrate 21 and the holding mechanisms 37, and transmitting the heat of the photoelectric conversion substrate 21 and the holding mechanisms 37 to the radiators 38. The heat conductors 36 also have a function of preventing the scintillator material from adhering to, for example, the radiators 38.

The holding mechanisms 37 are arranged in positions that oppose the respective heat conductors 36 and are closer than the heat conductors 36 to the center of the vacuum chamber 31. The holding mechanisms 37 hold the photoelectric conversion substrates 21, with the film-deposited surfaces of the photoelectric conversion substrates 21 exposed. Further, the holding mechanisms 37 hold the photoelectric conversion substrates 21 with the film-deposited surfaces inclined to form an acute angle with respect to the height direction of the vacuum chamber 31.

The radiators 38 are arranged in positions that oppose the respective heat conductors 36 and are closer than the heat conductors 36 to the respective side walls of the vacuum chamber 31. The radiators 38 are connected to the vacuum chamber 31 to transmit the heat occurring in the radiators 38 to the chamber 31. Each of the radiators 38 is an assembly of a heat conductor and a heater, although not shown in detail. The heater of each radiator 38 is used to heat the corresponding photoelectric conversion substrate 21. The temperature of each photoelectric conversion substrate 21 can be measured by a thermometer (not shown), and the temperature monitoring of each photoelectric conversion substrate 21 and the driving of the heater of each radiator 38 can be performed by a heater driving mechanism (not shown).

The heat generated by the heater of the radiator 38 is transmitted to the photoelectric conversion substrate 21 via the heat conductor 36 by the heat conduction. The heat generated by the heater of the radiator 38 may be transmitted to the photoelectric conversion substrate 21 via the heat conductor of the radiator 38 and the holding mechanism 37.

On the other hand, the heat of the photoelectric conversion substrate 21 is transmitted to the heat conductor of the radiator 38 via the heat conductor 36 by the heat conduction. The heat of the photoelectric conversion substrate 21 may be transmitted to the radiator 38 via the holding mechanism 37. The heat transmitted to the heat conductor of the radiator 38 is then transmitted to the vacuum chamber 31.

The motors 39 are airtightly attached to the vacuum chamber 31. The shaft of each motor 39 extends through the through holes formed in the corresponding radiator 38 and heat conductor 36. The holding mechanisms 37 are detachably attached to the respective shafts of the motors 39. The respective centers of the photoelectric conversion substrates 21 oppose the shafts of the motors 39. When the motors 39 operate, the holding mechanisms 37 rotate, with the result that the photoelectric conversion substrates 21 rotate about their respective rotation axes extending along the respective normal lines of the centers of the photoelectric conversion substrates 21.

In the embodiment, the vacuum deposition device 30 incorporates two heat conductors 36, two holding mechanisms 37, two radiators 38 and two motors 39. Accordingly, the vacuum deposition device 30 can simultaneously form two fluorescent films 22 on the two photoelectric conversion substrates 21. The two holding mechanisms 37 are arranged in symmetrical positions with respect to the vertical axis passing through the evaporation port 32a. Further, the two holding mechanisms 37 are obliquely arranged so as to make the respective film-deposited surfaces of the photoelectric conversion substrates 21 face each other. The angle α accomplished inside the respective film-deposited surfaces of the photoelectric conversion substrates 21 is an acute angle. The vacuum deposition device 30 is constructed as described above.

The evaporated element particles of the scintillator material emitted through the evaporation port of the crucible 32 are deposited on the photoelectric conversion substrates 21 provided in upper positions in the vacuum chamber 31. At this time, the evaporated element particles of the scintillator material are obliquely emitted onto the photoelectric conversion substrates 21. The angle of incidence of the scintillator material particles on each photoelectric conversion substrate 21 is set as θ. The incident angle θ is an angle made inside between the normal line of each photoelectric conversion substrate 21 and the line of the incident direction of the scintillator material (i.e., the imaginary line connecting the center of the evaporation port 32a to an arbitrary point on the film-deposited surface of each substrate 21).

In the embodiment, θ=60° at the central portion of each photoelectric conversion substrate 21, θ=70° at the upper-most portion of each photoelectric conversion substrate 21 (i.e., the end portion of each photoelectric conversion substrate 21 close to the ceiling wall of the vacuum chamber 31), and θ=45° at the lowermost portion of each photoelectric conversion substrate 21 (i.e., the end portion of each photoelectric conversion substrate 21 close to the crucible 32).

Compared to a vacuum deposition device where θ=0°, the vacuum deposition device 30 constructed as the above can reduce the required volume of the vacuum chamber 31. As a result, the load on, for example, the vacuum exhaust device can be reduced. Further, the time required for vacuuming can be shortened, the productivity can be enhanced.

Furthermore, in the vacuum deposition device 30, the efficiency of use of the scintillator material can be significantly enhanced.

A description will now be given of a method of manufacturing the fluorescent film 22 using the vacuum deposition device 30, included in a method of manufacturing the X-ray detection panel 2.

At the start of the manufacture of the fluorescent film 22, the vacuum deposition device 30 and the photoelectric conversion substrates 21 including photodetectors 28 are prepared. Subsequently, the photoelectric conversion substrates 21 are attached to the respective holding mechanisms 37. After that, the holding mechanisms 37 with the photoelectric conversion substrates 21 are carried into the vacuum chamber 31 and attached to the respective shafts of the motors 39.

Thereafter, the vacuum chamber 31 is airtightly closed, and is vacuumed using a vacuum exhaust device. Subsequently, the motors 39 are operated to rotate the photoelectric conversion substrates 21. The timing of the operation of the motors 39 is not limited, but may be changed in various ways. For instance, the timing of start operation of the motors 39 may be adjusted based on the monitored temperature of the crucible 32.

After that, the heating of the crucible 32 using the heaters 33 and 34, and the circulation of a coolant in a coolant path formed in the cover 35 are started. At this time, the scintillator material in the crucible 32 is evaporated and deposited on the photoelectric conversion substrates 21. Since the scintillator material deposited on the photoelectric conversion substrates 21 has heat, it heats the photoelectric conversion substrates 21 during the deposition period. By thus depositing the scintillator material on the photoelectric conversion substrates 21, fluorescent films 22 (see FIG. 2) are formed on the photoelectric conversion substrates 21. This is the termination of the manufacture of the fluorescent films 22.

A description will then be given of the pressure in the vacuum chamber 31.

The element particles of the scintillator material evaporated and deposited on the photoelectric conversion substrates 21 form crystal thereon. In the initial stage of deposition, fine crystal grains are formed on the photoelectric conversion substrates 21. However, when the deposition is continued, the crystal grains will grow into a columnar crystal. The growth direction of the columnar crystal is opposite to the incident direction of the evaporated element particles. Therefore, when the evaporated element particles are obliquely deposited on the photoelectric conversion substrates 21, oblique growth of the columnar crystal occurs on the substrates 21.

To suppress such oblique growth of the columnar crystal and put ahead columnar crystal growth along the normal lines of the photoelectric conversion substrates 21, in the conventional methods, an inactive gas, such as argon (Ar), is introduced into the vacuum chamber 31 during deposition, thereby increasing the pressure in the vacuum chamber 31 to about $1 \times 10^{-2}$ to 1 Pa. By virtue of the introduced inactive gas, the evaporated element particles are flown and guided onto the photoelectric conversion substrates 21 from many directions. As a result, the growth direction of the columnar crystal becomes parallel to the normal line of each photoelectric conversion substrate 21.

However, when the pressure in the vacuum chamber 31 is increased by the introduction of the inactive gas, the evaporated element particles are guided onto the photoelectric conversion substrates 21 from all directions, and hence the columnar crystal growth is accelerated also in a direction in which the columnar crystal is thickened. As a result, a thick columnar crystal is formed, which degrades the resolution of the X-ray detection panel 2. To overcome this problem, in the embodiment, when the scintillator material is deposited on the photoelectric conversion substrates 21, no inactive gas is introduced. Instead, vacuum deposition performed with a vacuum pressure of $1 \times 10^{-2}$ Pa or less maintained is utilized. This can suppress columnar crystal thickening growth, and accelerate crystal growth in direction along the normal line of each photoelectric conversion substrate 21.

The rotational speed of the photoelectric conversion substrates 21 will be described.

To average the incident directions of the evaporated element particles on the photoelectric conversion substrates 21, the photoelectric conversion substrates 21 are rotated when the scintillator material is deposited thereon. This enables the thickness of the fluorescent films 22 to be uniform over the entire surface of each photoelectric conversion substrate 21.

Further, the directions of the crystal growth vectors can be averaged, whereby the columnar crystal can be grown in direction along the normal line of each photoelectric conversion substrate 21 as a whole. The direction of the crystal growth vector corresponds to the growth direction of the columnar crystal. As a result, a thinner columnar crystal can be formed to thereby enhance the resolution of the X-ray detection panel 2.

To average the directions of the above-mentioned crystal growth vectors, the rotational speed of the photoelectric conversion substrates 21 is an essential factor. The inventors of the present application measured modulation transfer function (MTF) values relative to the rotational speed of each photoelectric conversion substrate 21. Results of an examination are shown in FIG. 4. FIG. 4 is a graph showing changes in MTF relative value to the rotational speed of a photoelectric conversion substrate 21. FIG. 4 shows MTF values associated with the peripheral portion of each photoelectric conversion substrate 21, obtained when the rotational speed of each photoelectric conversion substrate 21 is set to 2 rpm, 4 rpm and 6 rpm, and MTF values associated with the central portion of each photoelectric conversion substrate 21, obtained when the rotational speed of each photoelectric conversion substrate 21 is set to 2 rpm, 6 rpm and 10 rpm.

FIG. 4 does not show MTF values associated with the peripheral portion of each photoelectric conversion substrate 21, obtained when the rotational speed of each photoelectric conversion substrate 21 is set to 10 rpm, and MTF values associated with the central portion of each photoelectric conversion substrate 21, obtained when the rotational speed of each photoelectric conversion substrate 21 is set to 4 rpm. However, it can be understood that when the rotational speed of each photoelectric conversion substrate 21 is changed, the MTF values associated with the central portion of each photoelectric conversion substrate 21 and peripheral portions of each photoelectric conversion substrate 21 change substantially similarly. It is also understood that when the rotational speed of each photoelectric conversion substrate 21 becomes less than 4 rpm, the MTF values significantly drop.

In contrast, it can be understood that when the rotational speed of each photoelectric conversion substrate 21 becomes 4 rpm or more, the MTF values gradually increase. Therefore, when the photoelectric conversion substrates 21 are rotated, it is desirable that the rotational speed of the photoelectric conversion substrates 21 be set to 4 rpm or more. It is further desirable that the rotational speed of each photoelectric conversion substrate 21 be kept constant during deposition.

A description will be given of a lower limit for the incident angle θ at the center of each photoelectric conversion substrate 21.

Although in the embodiment, the vacuum deposition device 30 is formed to set θ=60° at the center of each photoelectric conversion substrate 21, the device is not limited to this but can be modified in various ways. The vacuum deposition device 30 may be formed to set θ<60° at the center of each photoelectric conversion substrate 21. However, the closer to 0° the incident angle θ, the greater the portion of the deposition surface of each photoelectric conversion substrate 21 that faces the bottom wall of the vacuum chamber 31. Namely, when the incident angle θ is closer to 0°, the width of the vacuum chamber 31 is greater, and hence the volume of the vacuum chamber 31 is greater. This is conspicuous when the photoelectric conversion substrates 21 are large.

Further, the volume compression rate of the vacuum chamber 31 is substantially proportional to sin θ (sine of the incident angle θ). In other words, the volume of the vacuum chamber 31 is substantially proportional to cos θ. Accordingly, when 0°≤θ<45°, the volume compression rate of the vacuum chamber 31 is relatively low, while when θ=45°, at last the volume compression rate of the vacuum chamber 31 is approx. 70%. Further, when 45°<θ, the volume compression rate is more greatly changes than in the case of θ=45°, whereby the volume compression rate of the vacuum chamber 31 is further increased. As a result, a more efficient reduction effect in the volume of the vacuum chamber 31 can be realized.

Consequently, when the apparatus load and productivity of, for example, the vacuum exhaust device, and the efficient use of the scintillator material are considered, it is desirable to form the vacuum deposition device 30 so that 45°≤θ is set at the center of each photoelectric conversion substrate 21.

A description will now be given of an upper limit for the incident angle θ at the center of each photoelectric conversion substrate 21.

FIG. 5 is a schematic view of part of the vacuum deposition device 30, showing the crucible 32 and one of the photoelectric conversion substrates 21. As shown in FIG. 5, the incident angle θ at the center of the deposition surface of the photoelectric conversion substrate 21 is set as $\theta_1$. Further, the distance (linear distance) from the evaporation port 32a of the crucible 32 to the center of (the deposition surface of) the photoelectric conversion substrates 21 is R, and the length of the photoelectric conversion substrate 21 from designated position to the center thereof along the surface thereof is L.

In a complete vacuum state, crystal grows in the direction opposite to the incident direction of evaporated element particles. Since the photoelectric conversion substrate 21 is rotated during the deposition, the growth directions of the columnar crystals at respective portions of the photoelectric conversion substrate 21 are determined from the integration results of deposition vectors Va (Va1, Va2, Va3). The directions of the deposition vectors are the incident directions of the evaporated element particles.

FIG. 6 is another schematic view of part of the vacuum deposition device 30, showing the crucible 32 and one of the photoelectric conversion substrates 21. It can be understood from FIG. 6 that at the uppermost portion of the photoelectric conversion substrate 21, the crystal growth vector is directed inwardly with respect to the photoelectric conversion substrate 21 (see, for example, a crystal growth vector Vb2). In contrast, it can be understood that at the lowermost portion of the photoelectric conversion substrate 21, the crystal growth vector is directed outwardly with respect to the photoelectric conversion substrate 21 (see, for example, a crystal growth vector Vb1). Since the photoelectric conversion substrate 21 is rotated during the deposition, the components of the crystal growth vectors Vb (Vb1, Vb2) that are parallel to the surface of the photoelectric conversion substrate 21 are offset.

Assume here that the component of each crystal growth vector Vb along the surface of the photoelectric conversion substrate 21 is Dh, and that the component of each crystal growth vector Vb along the normal line of the photoelectric conversion substrate 21 is Dv. Assuming as a simple simulation that the magnitude of each crystal growth vector Vb is inversely proportional to the square of the distance R, the components Dh and Dv at a position of the length L from the center of the photoelectric conversion substrate 21 are given by the following equations:

[Formula 1]

$$D_h = \frac{1}{R^2}\left\{\frac{\sin\theta_1 + x}{(1 + x^2 + 2x \cdot \sin\theta_1)^{3/2}} + \frac{\sin\theta_1 - x}{(1 + x^2 - 2x \cdot \sin\theta_1)^{3/2}}\right\} \quad \text{Formula 1}$$

[Formula 2]

$$D_v = \frac{1}{R^2}\left\{\frac{1}{(1 + x^2 + 2x \cdot \sin\theta_1)^{3/2}} + \frac{1}{(1 + x^2 - 2x \cdot \sin\theta_1)^{3/2}}\right\} \times \cos\theta_1 \quad \text{Formula 2}$$

The influence degree of the columnar crystal growth in the direction along the surface of the photoelectric conversion substrate 21 can be estimated by the component ratio (Dh/Dv) of the components Dh and Dv. In the above equations, x is the value that characterizes the relative distance between the photoelectric conversion substrate 21 and the evaporation port 32a of the crucible 32, and is the ratio (L/R) between the length L and the distance R (i.e., x=L/R).

FIG. 7 is a graph showing changes in the crystal growth vector component ratio (Dh/Dv) relative to the ratio (L/R) between the length L and the distance R, assumed when the incident angle $\theta_1$ is set to 40°, 45°, 50°, 60°, 70° and 75°. In the vertical axis of FIG. 7, "+" indicates the inward direction of the photoelectric conversion substrate 21, and "−" indicates the outward direction of the photoelectric conversion substrate 21. FIG. 7 shows simulation results obtained using the above formulas 1 and 2. As shown in FIG. 7, when the one side of the photoelectric conversion substrate 21 is 50 cm, the length L falls within a range of 0 to 25 cm. The distance R is actually a value in the vicinity of 150 cm (i.e., a value of from 100 cm and several tens millimeters to 200 cm) from the structure of the vacuum deposition device 30. Accordingly, the ratio (L/R) falls within a range of 0.15 to 0.2. In view of this range, it can be understood that if the incident angle $\theta_1$ is 70° or less, the ratio (Dh/Dv) can be set to less than 1.

In the actual growth of the columnar crystal, the component ratio (Dh/Dv) becomes lower than the values shown in FIG. 7 (becomes closer to 0) since forward deviation of the evaporation amount called a cosine rule occurs or there is an influence of a small amount of residual gas.

In view of the above-mentioned upper and lower limits for the incident angle θ, it is appropriate if 45°≤$\theta_1$≤70°. The above is a description concerning a simple simulation result.

The inventors made finer and more accurate simulations of the rotation effect of the photoelectric conversion substrate 21. As a result, it was detected that if 50°≤$\theta_1$≤65", a good crystal perpendicular property (a good acceleration property of crystal growth in direction along the normal line of the photoelectric conversion substrate 21) can be obtained. It was detected that if 55°≤$\theta_1$≤60°, a better crystal perpendicular property can be obtained, i.e., the inclination of the columnar crystal becomes substantially zero.

The content of the above fine and accurate simulation will be described.

To create model formulas concerning oblique deposition, it is important what type of coordinate system is employed. In light of the rotation of the photoelectric conversion substrate 21, such a coordinate system as shown in FIG. 8 is set. FIG. 8 shows a coordinate system in which coordinates are made to correspond to the vacuum chamber 31, the crucible 32 and the photoelectric conversion substrate 21.

As shown in FIG. 8, the deposition surface of the photoelectric conversion substrate 21 is set as the X-Y plane, and the rotation axis (the axis along the normal line of the center of the deposition surface) of the photoelectric conversion substrate 21 is set as the Z axis. A point O corresponds to the center of the evaporation port 32a. The central axis (vertical axis) of the crucible 32 passing through the point O is positioned on the X-Y plane. The intersection of the central axis of the crucible 32 and the X axis is set as T. For instance, the point T corresponds to the vertex of the vacuum deposition device 30. It can be assumed that evaporated element particles of the scintillator material are emitted from the point O in all directions symmetrically with respect to the central axis of the crucible 32.

The incident angle $\theta_1$ is a parameter characterizing oblique deposition, and is the angle made inside between the line segment connecting the origin of the coordinate system and the point O, and the Z axis. A point P exists on the deposition surface (X-Y plane) of the photoelectric conversion substrate 21, and expresses the position of deposition. Assuming that the moving radius (the linear distance between the coordinate origin and the point p) is L, and the rotation angle is ϕ, the X coordinate Xp, the Y coordinate Xp and the Z coordinate Zp of the point P can be expressed as follows:

$Xp = L \times \cos \phi$ $Yp = L \times \sin \phi$ $Zp = 0$

Further, the moving radius L is not longer than the linear distance LO between the coordinate origin and the point P.

Namely, $L \leq L_O$, and more practically, $L < L_O$. Furthermore, the angle made inside between the central axis (segment CT) of the crucible 32 and the line (segment OP) of incidence at the point P is η.

Firstly, a general formula will be derived. When deriving the general formula, the following four points are assumed:

(1) The interior of the vacuum chamber 31 is set in a sufficiently high vacuum state, and the evaporated element particles emitted from the crucible 32 directly reach the deposition surface of the photoelectric conversion substrate 21.

(2) The evaporated element particles are emitted symmetrically (axial symmetry) with respect to the central axis of the crucible 32.

(3) The direction of growth of columnar crystal at each instance is opposite to the incident direction of the evaporated element particles.

(4) The photoelectric conversion substrate 21 is rotated uniformly. Namely, the angle φ varies uniformly.

To derive the general formula, based on the coordinate system, the coordinates of the point P are expressed by the following formula 3, the coordinates of the point O are expressed by the following formula 4, the coordinates of the point T are expressed by the following formula 5, the vector from the point O to the point T is expressed by the following formula 6, and the vector from the point O to the point P is expressed by the following formula 7:

[Formula 3]
$$P = \begin{pmatrix} L\cos\phi \\ L\sin\phi \\ 0 \end{pmatrix} \quad \text{Formula 3}$$

[Formula 4]
$$O = \begin{pmatrix} R\sin\theta_1 \\ 0 \\ R\cos\theta_1 \end{pmatrix} \quad \text{Formula 4}$$

[Formula 5]
$$T = \begin{pmatrix} -L_O \\ 0 \\ 0 \end{pmatrix} \quad \text{Formula 5}$$

[Formula 6]
$$\vec{T} \equiv \overrightarrow{OT} = \begin{pmatrix} -L_O - R\sin\theta_1 \\ 0 \\ -R\cos\theta_1 \end{pmatrix} \quad \text{Formula 6}$$

[Formula 7]
$$\vec{W} \equiv \overrightarrow{OP} = \begin{pmatrix} L\cos\phi - R\sin\theta_1 \\ L\sin\phi \\ -R\cos\theta_1 \end{pmatrix} \quad \text{Formula 7}$$

Further, the following formula 8 is derived from the formula 6, and the following formula 9 is derived from the formula 7:

[Formula 8]
$$|\vec{T}|^2 = L_O^2 + R^2 + 2L_O R \sin\theta \quad \text{Formula 8}$$

[Formula 9]
$$|\vec{W}|^2 = L^2 + R^2 - 2LR \sin\theta_1 \cos\phi \quad \text{Formula 9}$$

FIG. 9 shows a coordinate system corresponding to the coordinate system of FIG. 8, and shows the growth direction (crystal growth vector) component of the columnar crystal at each instance (point P). As shown in FIG. 9, it is assumed that the component perpendicular to the (deposition surface of the) photoelectric conversion substrate 21 is Da, the component along the moving radius is Db, and the component in the rotation direction (φ direction) is Dc. Attention has been paid to the relative values of the components, and the coefficients for the components are all set to 1. The components Da, Db and Dc are given by the following Formulas 10, 11 and 12, respectively:

[Formula 10]
$$D_a = \frac{1}{|\vec{W}|^2} \times f(\eta) \times \frac{R\cos\theta_1}{|\vec{W}|} \quad \text{Formula 10}$$

[Formula 11]
$$D_b = \frac{1}{|\vec{W}|^2} \times f(\eta) \times \frac{R\sin\theta_1 \cos\phi - L}{|\vec{W}|} \quad \text{Formula 11}$$

[Formula 12]
$$D_c = \frac{1}{|\vec{W}|^2} \times f(\eta) \times \frac{(-R\sin\theta_1 \sin\phi)}{|\vec{W}|} \quad \text{Formula 12}$$

f(η) is a function expressing a distribution of evaporated element particles, and is a function of η in view of axis symmetry. Further, η itself is a function depending upon $\theta_1$, φ, L, $L_O$ and R, i.e., η ($\theta_1$, φ, L, $L_O$, R).

Based on the above, the growth directional component of the columnar crystal at the point P, which is obtained over the long term, can be obtained. Further, it should be noted that η and f are even functions associated with φ, as is evident from FIG. 8. In order to consider the effect of the rotation of the photoelectric conversion substrate 21, it is sufficient if integration is performed in association with φ.

The component perpendicular to (the deposition surface of) the photoelectric conversion substrate 21 is given by the following formula 13, and the moving direction component is given by the following formula 14:

[Formula 13]
$$\int_{-\pi}^{\pi} d\phi \frac{1}{|\vec{W}|^2} \times f(\eta) \times \frac{R\cos\theta_1}{|\vec{W}|} \quad \text{Formula 13}$$

[Formula 14]
$$\int_{-\pi}^{\pi} d\phi \frac{1}{|\vec{W}|^2} \times f(\eta) \times \frac{R\sin\theta_1 \cos\phi - L}{|\vec{W}|} \quad \text{Formula 14}$$

Further, the component in the rotation direction (φ direction) becomes zero (0) since it is obtained by integration of an odd function associated with φ.

To perform more specific calculation, a specific function form of f(η) is needed. As mentioned above, the angle distribution of evaporation from a minute plane can be approximated by the cosine rule. Accordingly, an approximation model of f(η)=cos (η) is employed. More specifically, the following relational formulas 15 and 16 are utilized:

[Formula 15]

$$\cos\eta = \frac{(\overline{T}, \overline{W})}{|\overline{T}||\overline{W}|}$$ Formula 15

[Formula 16]

$$(\overline{T}, \overline{W}) = R^2 + L_O R\sin\theta - (LL_O + LR\sin\theta_1)\cos\phi$$ Formula 16

It should be noted that T is a function that does not contain φ. In view of the above, a deposition model formula utilizing the rule of cosine can be obtained. The following formulas 17, 18 and 19 express a deposition model formula utilizing the rule of cosine. The formula 17 expresses a component perpendicular to (the deposition surface of) the photoelectric conversion substrate 21, the formula 18 expresses a component in the moving radius direction, and the formula 19 expresses a component in the rotation direction (φ direction).

[Formula 17]

$$\int_{-\pi}^{\pi} d\phi \frac{(\overline{T}, \overline{W})}{|\overline{W}|^4 |\overline{T}|} \times R\cos\theta_1$$ Formula 17

[Formula 18]

$$\int_{-\pi}^{\pi} d\phi \left\{ \frac{(\overline{T}, \overline{W})}{|\overline{W}|^4 |\overline{T}|} \times (R\sin\theta_1 \cos\phi - L) \right\}$$ Formula 18

[Formula 19]

$$\int_{-\pi}^{\pi} d\phi \left\{ \frac{(\overline{T}, \overline{W})}{|\overline{W}|^4 |\overline{T}|} \times (-R\sin\theta_1 \sin\phi) \right\} = 0$$ Formula 19

As mentioned above, regarding the component in the rotation direction (φ direction), integration of an odd function associated with φ is performed, and hence a result of zero is obtained.

Figure 10:
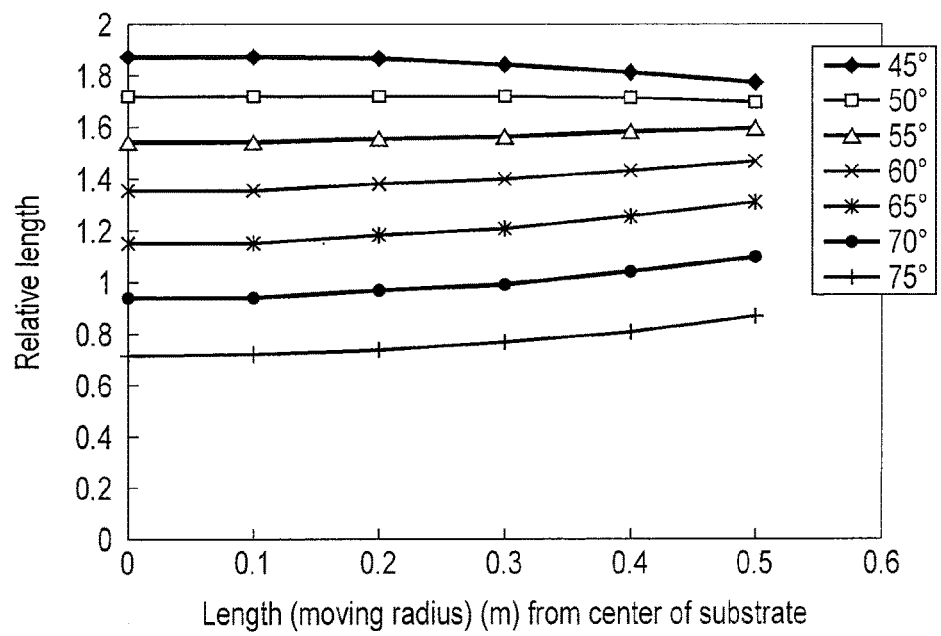
FIG. 10 is a graph showing changes in the length of the perpendicular component of a crystal growth vector relative to the length (=moving radius) from the center of a substrate, assumed under a predetermined condition when the incident angle is set to 45°, 50°, 55°, 60°, 65°, 70° and 75°.

To obtain those numerical values, numerical or analytical integration is performed. As a result, the deposition state can be simulated. FIG. 10 shows components perpendicular to (the deposition surface of) the photoelectric conversion substrate 21 and obtained by exact solution using the above-mentioned cosine rule.

FIG. 10 is a graph showing changes in the length of the perpendicular component of the crystal growth vector relative to the length (=moving radius) L from the center of (the deposition surface of) the photoelectric conversion substrate 21, assumed when the incident angle $\theta_1$ is set to 45°, 50°, 55°, 60°, 65°, 70° and 75°. In FIG. 10, actual values are supposed for Regarding the length L, a range of 0 to 0.5 m was set as an estimation target. If the photoelectric conversion substrate 21 has one side of 17 inches, the maximum value of the length L is 0.3 m (=0.43÷2×√2), where L satisfies the condition L≤0.5 m).

As is evident from FIG. 10, the perpendicular component of the crystal growth vector exhibits good uniformity regardless of the length L. Namely, it is understood that when 45°≤$\theta_1$≤70°, the perpendicular component of the crystal growth vector exhibits good uniformity. In other words, a uniform deposition thickness can be secured (a uniform thickness can be secured for the fluorescent film 22). It is also understood that when the incident angle $\theta_1$ is varied, the perpendicular component of the crystal growth vector (i.e., the deposited film thickness) entirely shifts. It is further understood that when the incident angle $\theta_1$ becomes greater, the deposition efficiency is lowered.

Figure 11:
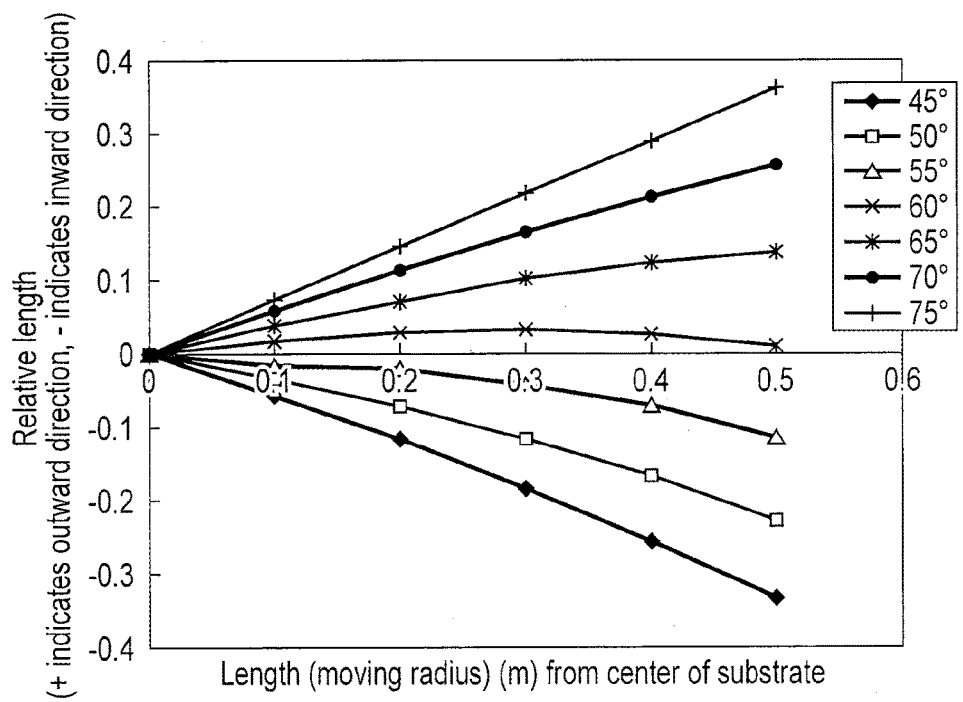
FIG. 11 is a graph showing changes in the length of the component (along the moving radius) of the crystal growth vector relative to the length (=moving radius) from the center of the substrate, assumed under the predetermined condition when the incident angle is set to 45°, 50°, 55°, 60°, 65°, 70° and 75°.

FIG. 11 shows the moving radius component. FIG. 11 is a graph showing changes in the length of the component (along the moving radius) of the crystal growth vector relative to the length (=moving radius) L from the center of (the deposition surface of) the photoelectric conversion substrate 21, assumed when the incident angle $\theta_1$ is set to 45°, 50°, 55°, 60°, 65°, 70° and 75°. In FIG. 11, $L_O$=1 m and R=1.5 m. Regarding the length L, a range of 0 to 0.5 m was set as an estimation target.

Regarding the vertical axis of FIG. 11, "−" indicates the inward direction of the photoelectric conversion substrate 21, and "+" indicates the outer direction of the photoelectric conversion substrate 21. In the inner portions indicated by "−," the columnar crystal inclines inwardly, while in the outer portions indicated by "+," the columnar crystal inclines outwardly.

As is evident from FIG. 11, in the central position (=rotation axis position) of (the deposition surface of) the photoelectric conversion substrate 21, the averaging effect of the moving radius component of the crystal growth vector can be obtained by the rotation of the photoelectric conversion substrate 21, whereby the moving radius component becomes zero. In contrast, there is a tendency for the moving radius component of the crystal growth vector to increase as the length L increases (L>0). This means that the tendency significantly depends upon the incident angle $\theta_1$. As shown, the inclination of the columnar crystal is substantially zero where 55°≤$\theta_1$≤60°. The ratio between the moving radius component and the perpendicular component of the crystal growth vector falls within ±3%, if L≤0.3 m. Even Where 50°≤$\theta_1$≤65°, the ratio between the moving radius component and the perpendicular component falls within ±10%, if L≤0.3 m. Thus, acquisition of crystal with a practically very excellent perpendicular property can be expected.

Figure 12:
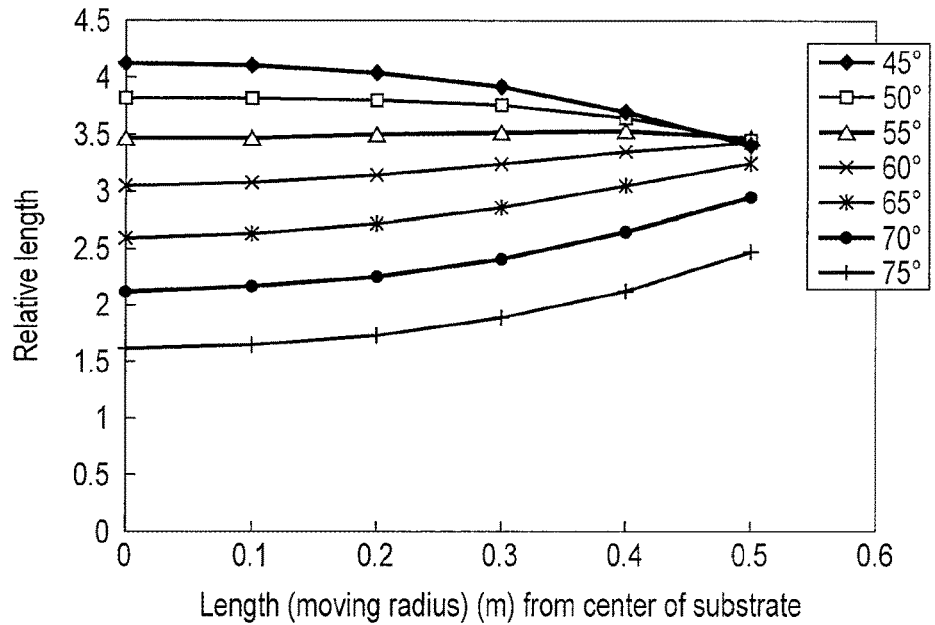
FIG. 12 is a graph showing changes in the length of the perpendicular component of the crystal growth vector relative to the length (=moving radius) from the center of the substrate, assumed under another predetermined condition when the incident angle is set to 45°, 50°, 55°, 60°, 65°, 70° and 75°.
Figure 13:
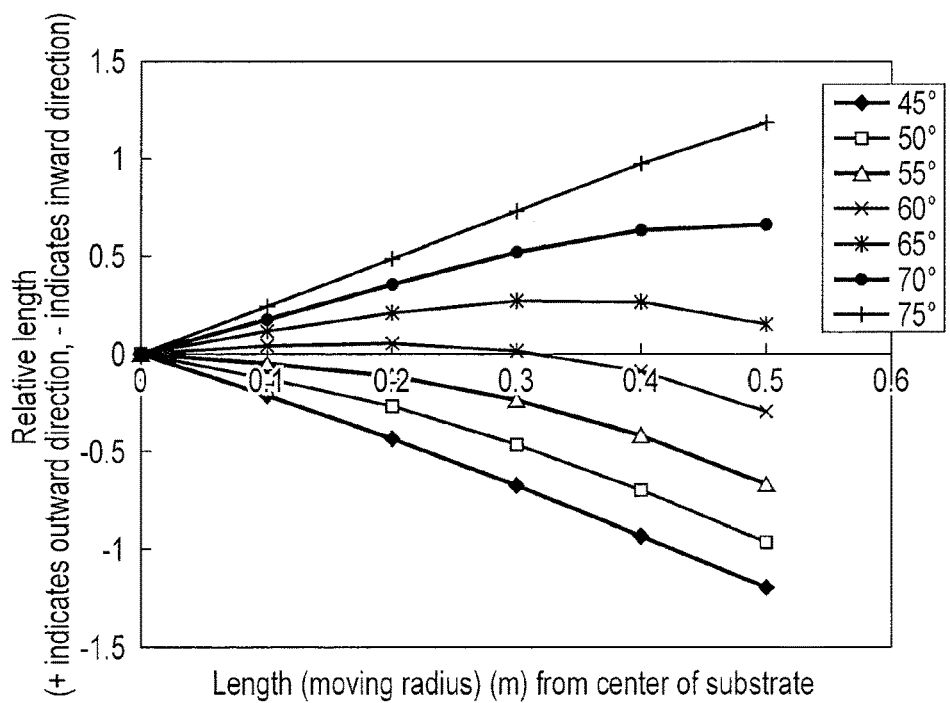
FIG. 13 is a graph showing changes in the length of the component (along the moving radius) of the crystal growth vector relative to the length (=moving radius) from the center of the substrate, assumed under said another predetermined condition when the incident angle is set to 45°, 50°, 55°, 60°, 65°, 70° and 75°.

As described above, FIGS. 10 and 11 show the estimation results obtained when $L_O$=1 m and R=1.5 m. FIGS. 12 and 13 show the estimation results obtained when $L_O$=1 m and R=1 m.

FIG. 12 is a graph showing changes in the length of the perpendicular component of the crystal growth vector relative to the length (=moving radius) L from the center of (the deposition surface of) the photoelectric conversion substrate 21, assumed when the incident angle $\theta_1$ is set to 45°, 50°, 55°, 60°, 65°, 70° and 75°. FIG. 13 is a graph showing changes in the length of the moving radius component of the crystal growth vector relative to the length (=moving radius) L from the center of (the deposition surface of) the photoelectric conversion substrate 21, assumed when the incident angle $\theta_1$ is set to 45°, 50°, 55°, 60°, 65°, 70° and 75°. Regarding the length L in FIGS. 12 and 13, a range of 0 to 0.5 m was set as an estimation target.

FIGS. 12 and 13 show tendencies similar to those of FIGS. 10 and 11 (R=1.5 m). However, it can be understood from these figures that as a result of the reduction of the distance R, the degree of uniformity of the perpendicular components of the crystal growth vectors is reduced, and the degree of variation in the inclinations of the moving radius components of the crystal growth vectors is increased.

However, even in these cases, the same conclusion as in the cases of FIGS. 10 and 11 is obtained. Namely, the inclination of the columnar crystal is substantially zero where 55°≤$\theta_1$≤60°. The ratio between the moving radius component and the perpendicular component of the crystal growth vector falls within ±6.5%, if L≤0.3 m. By arranging the photoelectric conversion substrate 21 to set $55°\leq\theta_1\leq 60°$, and setting the incident angle θ within a predetermined range, further enhancement of crystal perpendicular property can be expected.

Further, even where $50°\leq\theta_1\leq 65°$, the ratio between the moving radius component and the perpendicular component falls within a range of −13% to +10%, if L≤0.3 m. Thus, acquisition of crystal with an excellent perpendicular property can be expected. Therefore, when crystal of a scintillator material having a better perpendicular property is needed, it is desirable to set $50°\leq\theta_1\leq 65°$.

The temperature of the photoelectric conversion substrate 21 during the deposition period will be described.

In normal deposition, a method of heating a substrate, on which a film is deposited, to increase the adhesive force of the deposited film is employed. In this method, enhancement of the adhesive force of the film is intended by enhancing an active state between the surface of the substrate and the evaporated element particles deposited thereon.

The photoelectric conversion substrate 21 is formed by incorporating a-Si based TFTs 26 and PDs 27 on a glass substrate. Further, a protective layer is formed as the upper layer of the photoelectric conversion substrate 21, although it is not described above. The protective layer is used to smooth the surface of the photoelectric conversion substrate 21, to protect the substrate and to secure the electrical isolation of the same. In view of the required functions, the protective layer is an organic film, or a laminated layer of an organic film and a thin inorganic film.

When the scintillator material is deposited on the surface of the photoelectric conversion substrate 21, if the temperature of the photoelectric conversion substrate 21 is increased, the photoelectric conversion substrate 21 may be damaged or the fluorescent film 22 may be reduced in its adhesive force, thereby degrading the reliability. It should be noted that the X-ray image tubes employ a method and a structure in which a scintillator material is deposited on a substrate formed of aluminum, and therefore that it is not necessary to consider the temperature of the substrate during deposition.

From the above, it is desirable in consideration of the TFT 26, the PD 27 and the wiring connections that the temperature of the photoelectric conversion substrate 21 be set less than two hundreds and several tens centigrades (° C.). Furthermore, in consideration of the organic film (protective film), it is desirable to further reduce the temperature of the photoelectric conversion substrate 21.

As the material of the organic film, an acrylic- or silicone-based organic resin is particularly often used in view of its optical properties, photo-etching pattern forming function, etc. An epoxy resin may be also used as the material of the protective film. However, these materials all have glass transition points, and exhibit increases in thermal expansion coefficient or softening at temperatures above the glass transition points.

Therefore, if the temperature of the protection film (photoelectric conversion substrate 21) significantly exceeds the glass transition point during deposition, the resultant deposited film becomes unstable. In particular, in the initial deposition stage in which the fluorescent film 22 starts to be formed on the photoelectric conversion substrate 21, the temperature significantly influences the stability of the deposited film. In contrast, in consideration of the forming of the fluorescent film 22 (crystal film), it is desirable that the photoelectric conversion substrate 21 be increased to a higher temperature during deposition.

The inventors of the present application tested changes in the state of the fluorescent film 22 occurring in association with changes in the temperature of the photoelectric conversion substrate 21 during deposition. More specifically, it was tested whether exfoliation has occurred in the formed fluorescent film 22 to thereby determine the quality of the film 22. The temperature of the photoelectric conversion substrate 21 was changed during deposition between the initial stage and the stage thereafter. The initial deposition stage means the timing when the fluorescent film 22 starts to be formed on the photoelectric conversion substrate 21. More specifically, the deposition initiating timing can be set by opening a shutter provided at the tip (evaporation port) of the crucible 32. The following

TABLE 1

| Temperature of photoelectric conversion substrate in initial stage of deposition [° C.] | Temperature of photoelectric conversion substrate after initial stage [° C.] | Result | Judgment |
| --- | --- | --- | --- |
| 100 | 125 | No exfoliation on fluorescent film<br>No exfoliation on fluorescent film even after forcing test | Excellent |
| 125 | 160-170 | No exfoliation on fluorescent film<br>No exfoliation on fluorescent film even after forcing test | Excellent |
| 140 | 170-190 | No exfoliation on fluorescent film<br>Partial exfoliation found after forcing test | Good |
| 150-180 | 180-195 | Exfoliation found on fluorescent film | Bad |

As shown in Table 1, where the temperature of the photoelectric conversion substrate 21 was adjusted to 100° C. in the initial deposition stage, and to 125° C. after the initial stage, no exfoliation occurred on the formed fluorescent film 22. In this case, even after a forcing test was executed, no exfoliation occurred on the fluorescent film 22. The forcing test is, for example, a test in which a predetermined amount of a curable contractible resin, such as an epoxy resin, is coated on the fluorescent film 22 to thereby forcedly load film stress due to curing and contraction on a part of the fluorescent film 22.

Where the temperature of the photoelectric conversion substrate 21 was adjusted to 125° C. in the initial deposition stage, and to 160° C. to 170° C. after the initial stage, no exfoliation occurred on the formed fluorescent film 22, and even after the forcing test, no exfoliation occurred on the fluorescent film 22.

Where the temperature of the photoelectric conversion substrate 21 was adjusted to 140° C. in the initial deposition stage, and to 170° C. to 190° C. after the initial stage, no exfoliation occurred on the formed fluorescent film 22. However, after the forcing test, exfoliation occurred on the fluorescent film 22.

Where the temperature of the photoelectric conversion substrate 21 was adjusted to 150° C. to 180° C. in the initial deposition stage, and to 180° C. to 195° C. after the initial stage, exfoliation occurred on the formed fluorescent film 22.

The temperature of the photoelectric conversion substrate 21 in the initial deposition stage especially influences the stability of adhesion of the fluorescent film 22 to the photoelectric conversion substrate 21. If the temperature of the photoelectric conversion substrate 21 in the initial deposition stage exceeds 140° C., the risk of exfoliation of the formed fluorescent film 22 may significantly increase. Therefore, it is desirable to limit the temperature of the photoelectric conversion substrate 21 to 140° C. or less in the initial deposition stage.

After the initial deposition stage, an appropriate fluorescent film 22 with no exfoliation could be formed even at 125° C., as is mentioned above. Although film forming is possible even at a temperature less than 125° C., a temperature of 125° C. or more is appropriate, because the temperature after the initial deposition stage is associated with the crystal growth condition for the fluorescent film 22 and may also influence the properties of the fluorescent film 22, such as sensitivity. Therefore, 125° C. or more is appropriate range.

This being so, after the initial deposition stage, it is desirable to set the temperature of the photoelectric conversion substrate 21 within a range of 125° C. to 190° C. In this case, the fluorescent film 22 can be formed without exfoliation. As described above, in view of the adhesion stability of the fluorescent film 22 on the photoelectric conversion substrate 21, an upper limit for the temperature of the photoelectric conversion substrate 21 during deposition is determined.

On the other hand, a lower limit for the temperature of the photoelectric conversion substrate 21 during deposition is determined in view of characteristics. The inventors found that the sensitivity characteristic of the X-ray detection panel 2 correlates with the temperature of the photoelectric conversion substrate 21 in the initial deposition stage.

If the temperature of the photoelectric conversion substrate 21 in the initial deposition stage falls within a range of 65° C. to 85° C., the sensitivity characteristic is averagely proportional by a ratio of about 0.6 to the temperature of the photoelectric conversion substrate 21 in the initial deposition stage, although it is influenced by various factors. Accordingly, if the temperature of the photoelectric conversion substrate 21 in the initial deposition stage decreases, the sensitivity characteristic of the X-ray detection panel 2 decreases.

Further, if the temperature of the photoelectric conversion substrate 21 in the initial deposition stage decreases, the temperature of the photoelectric conversion substrate 21 after the initial deposition stage may well decrease. As a result, the above-mentioned influence on the crystal growth may occur. Furthermore, the above-described sensitivity reduction phenomenon could be confirmed. In view of the risk of reduction in the sensitivity of the X-ray detection panel 2, it is desirable to set, to 70° C. or more, the temperature of the photoelectric conversion substrate 21 in the initial deposition stage.

Moreover, from the above-described test results, when the scintillator material is deposited on the photoelectric conversion substrate 21, it is preferable in the embodiment to control the temperature of the photoelectric conversion substrate 21 in the initial deposition stage to the range of 70° C. to 140° C., and to control the temperature of the photoelectric conversion substrate 21 after the initial deposition stage to the range of 125° C. to 190° C.

It is further preferable to control the temperature of the photoelectric conversion substrate 21 in the initial deposition stage to the range of 70° C. to 125° C., and to control the temperature of the photoelectric conversion substrate 21 after the initial deposition stage to the range of 125° C. to 170° C.

A description will then be given of thermal conduction occurring inside the vacuum chamber 31.

FIG. 14 shows the photoelectric conversion substrate 21, the heat conductor 36, the holding mechanism 37 and the radiator 38 shown in FIG. 3, and is useful for explaining the function of the heat conductor 36. As aforementioned, to form the fluorescent film 22, a furnace of a large size is used as the crucible 32, and a scintillator material of several kilograms (e.g., 6 kg) is input into the crucible 32. The crucible 32 is heated to about 700° C. higher than the melting temperature of CsI.

Accordingly, a great amount of radiation heat is generated by the crucible 32, and the photoelectric conversion substrates 21 located at upper positions in the vacuum chamber 31 are heated intensely, as is shown in FIGS. 3 and 8. Further, since the evaporated element particles impart thermal energy to the photoelectric conversion substrates 21 during deposition, the temperature of the photoelectric conversion substrates 21 is greatly increased.

In light of this, the heat conductors 36 are opposed to the photoelectric conversion substrates 21 and the holding mechanisms 37 such that the former components cover the entire surfaces of the latter components. Assume here that the surface of each heat conductor 36 opposing the corresponding photoelectric conversion substrate 21 and holding mechanism 37 is defined as an obverse surface S1, and the other surface of each heat conductor 36 opposing the corresponding radiator 38 is defined as a reverse surface S2. Since the obverse surfaces S1 of the heat conductors 36 can absorb the heat emitted from the photoelectric conversion substrates 21 and the holding mechanisms 37, the photoelectric conversion substrates 21 can be protected from overheating, whereby the temperature of the substrates 21 can be controlled to the above-mentioned appropriate value.

Further, the heat conductors 36 can transmit radioactive heat to the radiators 38 from the reverse surface 2 side. When the heater of the radiators 38 are not driven, the radiators 38 function to transmit heat to the walls of the vacuum chamber 31 through heat conduction.

Radiation heat can be more efficiently transmitted between opposing members when the distance between the members is shorter. Accordingly, in the embodiment, each heat conductor 36 is interposed between holding mechanism 37 (photoelectric conversion substrate 21) and radiator 38 to make, as short as possible, the distance between the heat conductor 36 and the holding mechanism 37 (photoelectric conversion substrate 21), and the distance between the heat conductor 36 and the radiator 38.

Further, it is desirable to make the emissivities of the obverse and reverse surfaces S1 and S2 close to 1 to thereby form the heat conductors 36 of a material having a high heat conductivity. In this case, overheating of the photoelectric conversion substrates 21 can be further suppressed.

In the embodiment, the obverse and reverse surfaces S1 and S2 of the heat conductors 36 are subjected to a blackening treatment, whereby the heat conductors 36 can secure high emissivity. The blackened surfaces S1 and S2 exhibit an emissivity of about 95%, while a metal (e.g., aluminum) glazing surface exhibits an emissivity of several tens percents. Thus, it can be understood that the obverse and reverse surfaces S1 and S2 perform complete black-body radiation. It is more effective if the surfaces of the holding mechanisms 37 and the radiator 38 are also subjected to the blackening treatment for enhancing their emissivities.

In the method of manufacturing the X-ray detection panel description above, when a radiation panel is produced, the photoelectric conversion substrates 21 are arranged so that $45° \leq \theta \leq 70°$ is satisfied at the center of each photoelectric conversion substrate 21. After that, the fluorescent films 22 are formed by depositing the scintillator material on the photoelectric conversion substrates 21.

By setting $\theta$ not less than 45° ($45° \leq \theta$) at the center of each photoelectric conversion substrate 21, the load on, for example, the vacuum exhaust device can be reduced to thereby enhance the productivity and the efficient of use of the scintillator material. In particular, in the manufacture of large X-ray detection panels 2, the productivity can be enhanced. In addition, by setting $\theta$ not more than 70° ($\theta \leq 70°$) at the center of each photoelectric conversion substrate 21, $(Dh/Dv)<1$ can be established, thereby enabling a finer columnar crystal to be formed. This contributes to enhancement of the resolution of the X-ray detection panel 2.

The embodiment utilizes vacuum vapor deposition performed under a pressure of $1 \times 10^{-2}$ Pa or less. As a result, columnar crystal thickening can be suppressed, and crystal growth along the normal lines of the photoelectric conversion substrates 21 be accelerated.

Further, in the embodiment, the rotational speed of the photoelectric conversion substrates 21 is set to 4 rpm or more. As a result, the MTF values are gradually increased, which contributes to enhancement of the resolution of the X-ray detection panel 2.

When depositing the scintillator material on the photoelectric conversion substrates 21, the temperature of the photoelectric conversion substrates 21 is controlled within a range of 70° C. to 140° C. in the initial deposition stage, and the temperature of the photoelectric conversion substrates 21 is controlled within a range of 125° C. to 190° C. after the initial deposition stage. As a result, the fluorescent films 22 can be formed without exfoliation, which contributes to forming of an X-ray detection panel 2 with excellent sensitivity.

As described above, the embodiment can provide the method of manufacturing the X-ray detection panel 2 capable of enhancing productivity, and capable of forming a fluorescent film 22 that contributes to enhancement of the resolution characteristic of the X-ray detection panel 2. The embodiment can also provide the method of manufacturing the X-ray detection panel 2 capable of forming fluorescent films 22 with a high manufacturing yield.

Although a certain embodiment has been described above, it is merely an example and does not limit the scope of the invention. Various omissions, various replacements and/or various changes may be made in the embodiment without departing from the scope of the invention. The embodiment and their modifications are included in the scope of the invention, namely, in the inventions recited in the claims and equivalents thereof.

For instance, in the above-described embodiment, two X-ray detection panels 2 are simultaneously manufactured. However, the above-described advantage can be obtained even when only one X-ray detection panel 2 is manufactured, or when three X-ray detection panels 2 are simultaneously manufactured. When simultaneously manufacturing three X-ray detection panels 2, the vacuum deposition device 30 comprises three heat conductors 36, three holding mechanisms 37, three radiators 38 and three motors 39. For example, the three holding mechanisms 37 can be arranged at circumferential intervals of 120° around the axis (vertical axis) of the crucible 32.

Only CsI may be input into the crucible 32. In this case, the above-mentioned advantage can also be obtained if TlI is input into another crucible (a small crucible) prepared in addition to the crucible 32 (a large crucible), thereby simultaneously depositing CsI and TlI.

The shape of the heat conductors 36 is not limited to a plate-like one, but may be changed in various ways such a block structure. It is sufficient if the heat conductors 36 have a shape that matches the arrangement of the photoelectric conversion substrates 21, the shape of the holding mechanisms 37, the positions of the radiators 38, etc. Although in the above-described embodiment, the heat conductors 36 are formed of aluminum to enhance the thermal conductivity, the material of the conductors is not limited to aluminum. The heat conductors 36 may be formed of, for example, copper (Cu).

Although in the above embodiment, the scintillator material contains cesium iodide (CsI) as a main component, it is not limited to this. Even if another material is used as the scintillator material, a similar advantage to the above can be obtained.

The above-described technique is not limited to an apparatus and method of manufacturing X-ray detection panels, but is also applicable to an apparatus and method of manufacturing various types of radiation detection panels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a radiation detection panel, comprising:

positioning a photoelectric conversion substrate vertically above an evaporation source such that a deposition surface of the photoelectric conversion substrate is exposed to the evaporation source and inclined with respect to a vertical axis; and evaporating a scintillator material and emitting the scintillator material vertically upward by the evaporation source to deposit a fluorescent film on the deposition surface, wherein when the scintillator material is deposited on the deposition surface, the photoelectric conversion substrate is rotated, the photoelectric conversion substrate is positioned to satisfy 45'≤θ≤70° at a center of the deposition surface, where θ is an angle made inside between an incident direction of the scintillator material and a normal line of the deposition surface; and the photoelectric conversion substrate is rotated by setting a rotation axis as an axis along a normal line of the center of the deposition surface.

2. The method of claim 1, wherein the photoelectric conversion substrate is positioned to satisfy 50°≤θ≤65° at the center of the deposition surface.

3. The method of claim 1, wherein an angle between a vertical axis passing through the scintillator material and the deposition surface is less than 30°.

4. The method of claim 1, wherein a vacuum deposition method in which deposition is performed under a vacuum pressure of $1\times10^{-2}$ Pa or less is utilized.

5. The method of claim 1, wherein the photoelectric conversion substrate is rotated at a rotational speed of 4 rpm or more.

6. The method of claim 1, wherein the scintillator material contains cesium iodide (CsI) as a main component.

* * * * *